United States Patent [19]
Allen

[11] Patent Number: 5,847,431
[45] Date of Patent: Dec. 8, 1998

[54] REDUCED CAPACITANCE TRANSISTOR WITH ELECTRO-STATIC DISCHARGE PROTECTION STRUCTURE

[75] Inventor: Michael J. Allen, Rescue, Calif.

[73] Assignee: Intel Corporation, Santa Clara, Calif.

[21] Appl. No.: 993,441

[22] Filed: Dec. 18, 1997

[51] Int. Cl.[6] .................................................. H01L 23/62
[52] U.S. Cl. ........................ 257/355; 257/356; 257/358
[58] Field of Search .................................... 257/197, 200, 257/593, 355, 356, 357, 358, 389, 360, 369; 438/315, 413

[56] References Cited

U.S. PATENT DOCUMENTS

| | | | |
|---|---|---|---|
| 3,876,480 | 4/1975 | Davidsohn et al. | 438/413 |
| 4,684,967 | 8/1987 | Taylor, Sr. et al. | 257/394 |
| 4,893,157 | 1/1990 | Miyazawa et al. | 257/358 |
| 5,121,179 | 6/1992 | Sasaki | 257/358 |
| 5,438,213 | 8/1995 | Tailliet | 257/360 |
| 5,485,025 | 1/1996 | Chau et al. | 257/198 |
| 5,504,361 | 4/1996 | Blossfeld | 257/355 |
| 5,512,496 | 4/1996 | Chau et al. | 438/315 |
| 5,623,156 | 4/1997 | Watt | 257/355 |
| 5,623,787 | 4/1997 | Ali | 257/355 |
| 5,684,321 | 11/1997 | Okamura | 257/355 |
| 5,760,446 | 6/1998 | Yang | 257/357 |

*Primary Examiner*—Carl W. Whitehead
*Attorney, Agent, or Firm*—Blakely, Sokoloff, Taylor & Zafman LLP

[57] ABSTRACT

An apparatus is disclosed for providing a reduced-capacitance transistor with ESD protection that can be fabricated using standard processes. The transistor includes a substrate, a source region formed in the substrate, and a well region also formed in the substrate. The transistor further includes a drain region having a first end region, a second end region, and a resistive region positioned between the first and second end regions. The drain region is formed at least partially in the well region. A drain contract is form on the first end region of the drain region. Additionally, a gate structure is included. The gate structure is formed on the substrate between the source region and the second end region of the drain region. The gate structure defines a channel region that couples the source to the drain region.

7 Claims, 4 Drawing Sheets

REDUCED CAPACITANCE TRANSISTOR WITH ELECTRO-STATIC DISCHARGE PROTECTION STRUCTURE

BACKGROUND OF THE INVENTION

1. Field of the Invention

The present invention pertains to the field of semiconductor transistors. More particularly, this invention pertains to the field of reducing capacitance in transistors with electro-static discharge protection structures.

2. Background of the Related Art

In an effort to improve performance in computer systems, bus interfaces between computer system components are being pushed to higher and higher switching rates. A limiting factor in increasing bus switching rates is the capacitance of the signal pins of components that are connected to the bus. The capacitance of the signal pins reduces the switching frequency that can be obtained while maintaining proper signal integrity. The pin capacitance is made up of several factors such as package leadframe capacitance, bondpad capacitance, electro-static discharge (ESD) protection structures, and output driver (transistor) capacitance.

FIG. 1 shows an example of a transistor with ESD protection. The transistor 100 of FIG. 1 includes a source region 140 formed in a substrate 110, a source contact 145, a gate 130 formed on a dielectric material 135, a drain region 120 formed in the substrate 110, and a drain contact 125. The drain region 120 is made large in order to prevent current crowding. Current crowding during an ESD event may cause a large current to focus on a small area of semiconductor material and thus cause damage to the device. By increasing the size of the drain region, the current during an ESD event is less likely to focus on a small area, thereby reducing the likelihood of damage to the device.

The increased size of the drain region as described above has the disadvantage of increasing the output drain capacitance, perhaps by as much as 2 or 3 times over minimum dimensions. The output drain capacitance is largely a function of drain region area and depletion region width at the p-n junction formed by the substrate 110 and the drain region 120.

FIG. 2 depicts a transistor 200 embodying a technique used to reduce the output drain capacitance while maintaining ESD protection properties. The transistor 200 includes a source region 240 formed in a substrate 210, a source contact 245, a gate 230 formed over a dielectric material 235, a first drain region 230 formed in the substrate 210, a resistive region 215 formed in the substrate 210, a second drain region 227 formed in the substrate 210, and a drain contact 225 formed on the second drain region 227. In transistor 200, the resistive region 215 provides the ESD protection. The resistive region 215 is of the same conductivity type as the first and second drain regions 220 and 227, but is more lightly doped. Because the resistive region 215 is lightly doped, the depletion region width at the p-n junction formed by the substrate 210 and the resistive region 215 is much greater that the depletion region width achieved by the transistor 100 of FIG. 1. The increase in depletion region width results in a decrease in capacitance while maintaining ESD protection characteristics.

The above mentioned transistors 100 and 200 require different steps during the fabrication process. The formation of the transistor 200 requires that the resistive region 215 be formed then a mask to be formed over the resistive region 215 during the formation of the source region 240 and drain regions 220 and 227. Many processes that fabricate transistor structures similar to that of the transistor 100 depicted in FIG. 1 typically do not readily the ability to form the structure shown in FIG. 2 due to the extra steps involved in masking the resistive region during formation of the source and drain regions. Consequently, while some processes are able to take advantage of the capacitance reduction using the structure shown in FIG. 2, many are not. For these reasons, a reduced-capacitance transistor with ESD protection that can be fabricated without significant additional processing is desirable.

SUMMARY OF THE INVENTION

A reduced-capacitance transistor with ESD protection and a method for forming the same is disclosed. The transistor includes a substrate, a source region formed in the substrate, and a well region also formed in the substrate. The transistor further includes a drain region having a first end region, a second end region, and a resistive region positioned between the first and second end regions. The drain region is formed at least partially in the well region. A drain contact is form on the first end region of the drain region. Additionally, a gate structure is included. The gate structure is formed on the substrate between the source region and the second end region of the drain region. The gate structure defines a channel region that couples the source region to the drain region.

DETAILED DESCRIPTION

A reduced-capacitance transistor with ESD protection formed using standard fabrication processes is disclosed. In the following description, for the purposes of explanation, specific details are set forth to provide a thorough understanding of the invention. However, it will be apparent to one skilled in the art that these specific details are not required to practice the invention. In other instances, well known methods, devices, and structures are not described in particular detail in order to avoid obscuring the invention.

Overview

The invention solves the problem of reducing capacitance in transistors that have large drain regions that serve as ESD protection structures. In general, and in accordance with one embodiment of the invention, a transistor is formed including a substrate, a source region formed in the substrate, a gate structure defining a channel region in the substrate, and a well region also formed in the substrate. The transistor further includes a drain region formed at least partially in the well region. The well region is of the same semiconductor type as the source and drain regions, but is more lightly doped than the source and drain regions. By forming the drain region at least partially within the well region, the width of the depletion region formed by the p-n junction between the substrate and the drain is increased, thereby decreasing the capacitance between the drain region and the substrate.

Embodiments of the Invention

Figure 1:
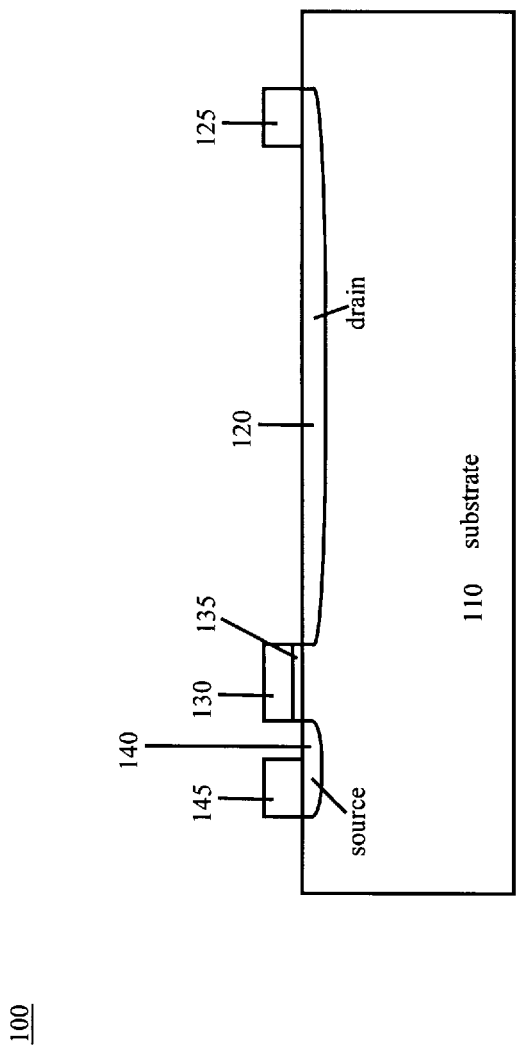
FIG. 1 shows an example transistor with ESD protection implemented in accordance with the prior art.
Figure 2:
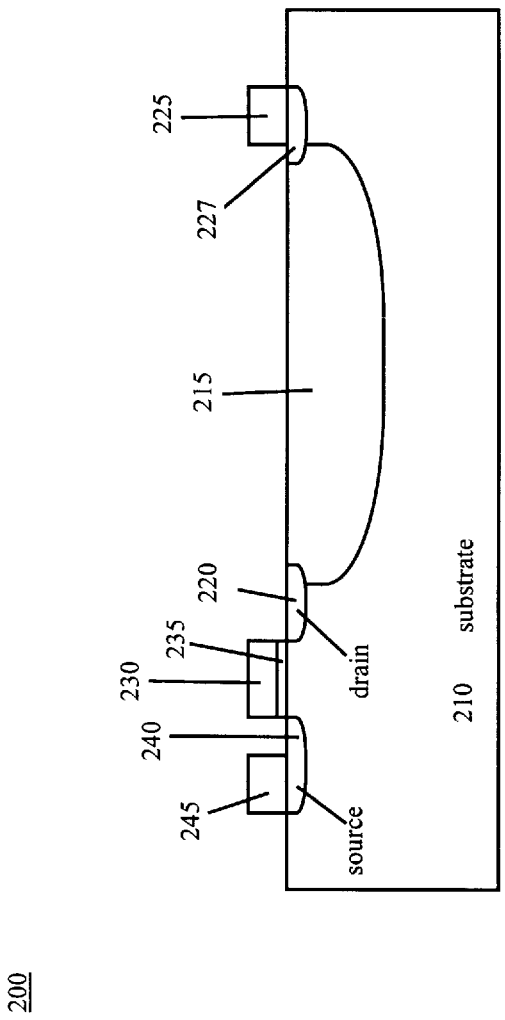
FIG. 2 depicts a reduced capacitance transistor with ESD protection formed using a non-standard fabrication process and implemented in accordance with the prior art.
Figure 3:
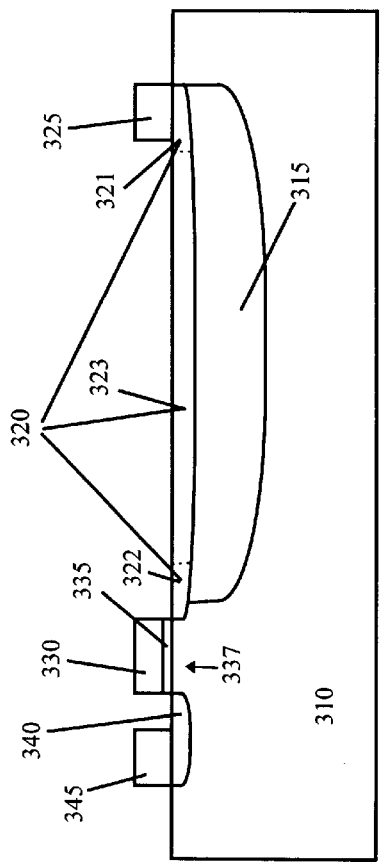
FIG. 3 illustrates a reduced-capacitance transistor with ESD protection formed using standard fabrication processes and implemented in accordance with the invention.

FIG. 3 illustrates an example embodiment of a reduced-capacitance transistor 300 with ESD protection formed using standard fabrication processes and implemented in accordance with the invention. The transistor 300 includes a substrate 310, a source region 340 formed in the substrate, a gate structure including a gate contact 330 formed on a dielectric material 335 which is formed on the substrate, and a drain region 320 which includes a first end region 321, a second end region 322, and a resistive region 323 located between the first end region 321 and the second end region 322. The gate contact 330 and the dielectric material 335 define a channel region 337 in the substrate 310.

For this example transistor, the substrate 310 is formed of p–type semiconductor material, while the source region 340 and the drain region 320 are formed of n+type semiconductor material. P type semiconductor material is typically formed by introducing a dopant such as boron into silicon. N type semiconductor material is typically formed by introducing a dopant such as arsenic into silicon. Other dopants are possible. Diffusion and ion implantation are two recognized methods of introducing dopants into silicon. The symbol "–" following "p" or "n" as used herein indicates that the "p" or "n" type semiconductor material is lightly doped. The symbol "+" following "p" or "n" as used herein indicates that the "p" or "n" type semiconductor material is heavily doped.

A source contact 345 is formed on the source region 340 and a drain contact 325 is formed on the first end region 321 of the drain region 320. The source contact 345, the drain contact 325, and the gate contact 330 are preferably formed of polysilicon, although other electrically conductive materials may be used. The dielectric material 335 is preferably silicon dioxide. Other dielectric materials may also be used. The present example transistor has a gate length of preferably 0.25 micron ($\mu$), although a broad range of other dimensions are possible. For example, the invention may be practiced with a gate length of 0.1 $\mu$. The drain region is preferably formed to a depth of approximately 0.3 $\mu$ using ion-implantation, but other depths are possible and any method for introducing dopants into a semiconductor material may be used to form the drain region.

The resistive region 323 within the drain region 320 serves as an ESD protection structure. Enhanced ESD protection is achieved by increasing the size of the drain region 320 by inclusion of the resistive region 323. In the present example embodiment, the resistive region has a length of preferably approximately 5 $\mu$. A broad range of other lengths are possible. During an ESD event, the potentially large current is spread out over a greater area instead of focusing on a small area. This technique of providing ESD protection is discussed above in the background section. In prior transistors with such an ESD structure, the capacitance between the large drain region and the substrate would be large compared to transistors with smaller drain regions. The invention reduces this capacitance by introducing a well region 315 between at least a portion of the drain region 320 and the substrate 310. The well region 315 is formed using standard well fabrication techniques that are well known in the art. Most semiconductor fabrication processes use wells. Consequently, the well region 315 can be formed during the normal well fabrication process, and no significant extra processing is required.

The well region 315 is formed before the formation of the drain region 320. The well region 315 in this example embodiment is preferably formed of n–type semiconductor material. The n–type semiconductor material for the well region 315 is preferably formed by defusing a dopant such as phosphorus into the silicon substrate, although other dopants are possible. The well region 315 may also be formed by ion-implantation or any other method for introducing dopants into a semiconductor material. The well region 315 is formed to a depth of preferably 3 $\mu$ beneath the drain region 320 and is formed to extend from beneath the drain contact 325 to within 1 $\mu$ of the channel region 337. The invention may be practiced using a broad range of well region depths. While the well region 315 in this example preferably extends to within 1 $\mu$ of the channel region, the invention may be practiced with the well region 315 not extending to with 1 $\mu$. The tradeoff is that the greater amount of drain region 320 that is exposed to the substrate 310, the greater the amount of capacitance. Thus, it is desirable for the well region to extend as close as possible to the channel region without adversely affecting transistor performance or manufacturability.

In the discussion above regarding the example transistor 300, the substrate 310 is mentioned as being formed of a p type semiconductor material and the source 340, drain 320, and well 315 regions are mentioned as being formed of n type semiconductor material. However, the invention may also be practiced with an n type substrate and p type source, drain, and well regions.

Figure 4:
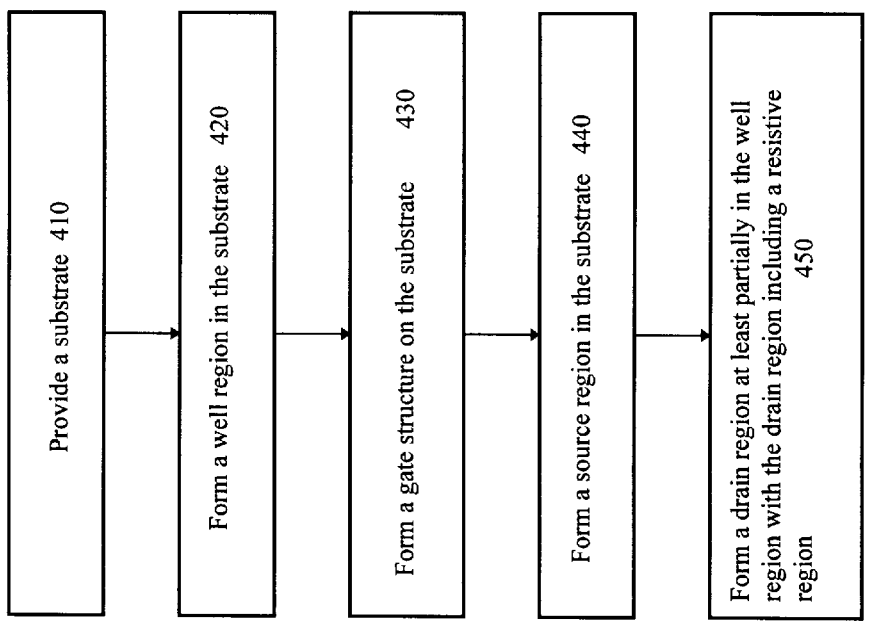
FIG. 4 is a flow diagram of a method for forming a reduced-capacitance transistor with ESD protection using standard fabrication processes and implemented in accordance with the invention.

FIG. 4 is a flow diagram of an example method for forming a reduced-capacitance transistor with ESD protection using standard fabrication processes and implemented in accordance with the invention. At step 410, a substrate is provided. The substrate may have any of the properties discussed above in connection with FIG. 3. At step 420, a well region is formed in the substrate. Following step 420, a gate structure is formed on the substrate. Once the gate structure is formed, a source region is formed in the substrate at step 440. At step 450, a drain region, including a resistive region, is formed. The drain region is formed at least partially in the well region. The properties of the substrate, source region, drain region, and well region provided or formed in steps 410, 420, 430, 440, and 450 conform to the properties for these structures as discussed above in connection with FIG. 3.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded in an illustrative rather than in a restrictive sense.

What is claimed is:

1. A reduced capacitance transistor with ESD protection, comprising:
   a substrate;
   a source region formed in the substrate;
   a well region formed in the substrate;
   a drain region formed at least partially in the well region, the drain region including a first end region and a second end region, the drain region further including a resistive region between the first end region and the second end region;
   a drain contact formed on the first end region of the drain region; and
   a gate structure formed on the substrate between the source region and the second end region of the drain region, the gate structure defining a channel region that couples the source region to the drain region.

2. The transistor of claim 1 wherein the well region extends from the first end region of the drain region to within 1 $\mu$ of the channel region.

3. The transistor of claim 1 wherein the well region extends into the substrate to a depth of approximately in the range of 1 $\mu$ to 4 $\mu$.

4. The transistor of claim 1 wherein the drain region extends into the well region to a depth of approximately in the range of 0.1 $\mu$ to 0.4 $\mu$.

5. The transistor of claim 1 wherein the resistive region has a length of approximately in the range of 2 $\mu$ to 7 $\mu$.

6. The transistor of claim 1 wherein the well region comprises an n-type semiconductor region and wherein the drain region comprises an n+type region.

7. The transistor of claim 1 wherein the well region comprises a p-type semiconductor region and wherein the drain region comprises a p+type semiconductor region.

* * * * *

UNITED STATES PATENT AND TRADEMARK OFFICE
CERTIFICATE OF CORRECTION

PATENT NO. : 5,847,431
DATED : December 8, 1998
INVENTOR(S) : Allen

It is certified that error appears in the above-identified patent and that said Letters Patent is hereby corrected as shown below:

Title page,
Item [54], delete "CONTRACT" and insert -- CONTACT --.

Signed and Sealed this

Twenty-fourth Day of June, 2003

JAMES E. ROGAN
*Director of the United States Patent and Trademark Office*